(12) United States Patent
Uwazumi et al.

(10) Patent No.: US 6,716,542 B2
(45) Date of Patent: Apr. 6, 2004

(54) SPUTTERING TARGET FOR PRODUCTION OF A MAGNETIC RECORDING MEDIUM

(75) Inventors: Hiroyuki Uwazumi, Kawasaki (JP); Tadaaki Oikawa, Kawasaki (JP)

(73) Assignee: Fuji Electric Co., Ltd., Kanagawa (JP)

( * ) Notice: Subject to any disclaimer, the term of this patent is extended or adjusted under 35 U.S.C. 154(b) by 353 days.

(21) Appl. No.: 09/789,928

(22) Filed: Feb. 22, 2001

(65) Prior Publication Data

US 2001/0044018 A1 Nov. 22, 2001

(30) Foreign Application Priority Data

Feb. 23, 2000 (JP) ......................... 2000-046471

(51) Int. Cl.$^7$ ............... G11B 5/65; C23C 14/00
(52) U.S. Cl. ............... 428/694 T; 428/694 TR; 204/192.2
(58) Field of Search .................. 252/62.51, 62.55, 252/62.57, 62.59; 148/100, 122; 427/130, 131, 255.28, 255.31; 428/428, 432, 448, 450, 457, 546, 551, 553, 556, 564, 565, 579, 611, 630, 632, 668, 694 TR, 694 T, 697, 702, 900, 141, 323; 332/330

(56) References Cited

U.S. PATENT DOCUMENTS

| | | | | |
|---|---|---|---|---|
| 5,478,661 A | * | 12/1995 | Murayama et al. ...... 204/192.2 |
| 5,558,977 A | * | 9/1996 | DePalma et al. ........... 428/900 |
| 5,589,221 A | * | 12/1996 | Hiramoto et al. ........... 148/122 |
| 5,658,659 A | * | 8/1997 | Chen et al. ................. 428/332 |
| 5,679,473 A | * | 10/1997 | Murayama et al. ......... 428/900 |
| 5,774,783 A | * | 6/1998 | Kaitsu et al. ............... 428/450 |
| 6,139,766 A | * | 10/2000 | Taguchi et al. .......... 252/62.57 |
| 6,174,597 B1 | * | 1/2001 | Yusu et al. ................. 428/900 |
| 6,436,542 B1 | * | 8/2002 | Ogino et al. ................ 428/702 |
| 6,472,047 B1 | * | 10/2002 | Kirino et al. ............... 428/323 |

FOREIGN PATENT DOCUMENTS

| JP | 05-311413 | 11/1993 | ........... C23C/14/34 |
|---|---|---|---|
| JP | 08-255342 | 10/1996 | ........... G11B/5/84 |

* cited by examiner

*Primary Examiner*—Steven A. Resan
*Assistant Examiner*—Louis Falasco
(74) *Attorney, Agent, or Firm*—Marina V. Schneller; Venable LLP

(57) ABSTRACT

The present invention provides a sputtering target for production of a magnetic recording medium including at least a nonmagnetic undercoat layer, a magnetic layer, and a protective layer laminated sequentially on a nonmagnetic substrate, the sputtering target being used for film formation of the magnetic layer, the sputtering target comprising a mixture of a metal and an oxide, and the particle diameter of the oxide in the sputtering target being 10 $\mu$m or less. The sputtering target suppresses abnormal discharge occurring during film formation of a granular magnetic layer of the magnetic recording medium, and suppresses occurrence of foreign objects on the magnetic recording medium.

3 Claims, 4 Drawing Sheets

SPUTTERING TARGET FOR PRODUCTION OF A MAGNETIC RECORDING MEDIUM

This application is based on Japanese Patent Application No. 2000-46471 filed Feb. 23, 2000, the content of which is incorporated hereinto by reference.

BACKGROUND OF THE INVENTION

1. Field of the Invention

This invention relates to a sputtering target for production of a magnetic recording medium, which is used for film formation of a magnetic layer of the magnetic recording medium mounted in various magnetic recording devices, including external storage devices of computers. The invention also relates to a method for producing a magnetic recording medium by use of the sputtering target, and a magnetic recording medium produced by this method for production.

Hereinafter, the sputtering target will be referred to simply as a "target".

2. Description of the Related Art

Various compositions and structures of a magnetic layer and various materials for a nonmagnetic undercoat layer have been proposed for a magnetic recording medium required to have a high recording density and a low noise. In recent years, a proposal has been made for a magnetic layer, generally called a granular magnetic layer, which has a structure comprising magnetic crystal grains surrounded with a nonmagnetic nonmetallic substance such as an oxide or a nitride.

The granular magnetic layer is considered to obtain low noise characteristics for the following reason: A nonmagnetic nonmetallic grain boundary phase physically separates the magnetic grains. Thus, the magnetic interaction between the magnetic grains lowers to suppress the formation of zigzag domain walls occurring in a transition region of recording bits.

Examples using the granular magnetic layer are shown in Japanese patent Application Laid-open No. 8-255342 (1996) and U.S. Pat. No. 5,679,473, Japanese Patent Application Laid-open No. 8-255342 (1996) proposed the achievement of a low noise by laminating a nonmagnetic film, a ferromagnetic film, and a nonmagnetic film sequentially and then heat treating the laminate to form a granular recording layer comprising ferromagnetic crystal grains dispersed in the nonmagnetic film. In this case, a silicon oxide or nitride is used as the nonmagnetic film.

U.S. Pat. No. 5,679,473 describes that RF sputtering is performed with the use of a CoNiPt target incorporating an oxide such as $SiO_2$, whereby there can be formed a granular recording layer having a structure comprising magnetic crystal grains surrounded by a nonmagnetic oxide and thereby individually separated. As a result, a magnetic recording medium having high Hc (coercive force) and a low noise is obtained. The method described in U.S. Pat. No. 5,679,473, for film formation of a granular magnetic layer by performing RF sputtering using a CoNiPt target incorporating an oxide such as $SiO_2$, can produce a magnetic recording medium without involving process such as heat treatment, and is thus excellent in mass producing ability.

However, when a target having an oxide dispersed in a metal is sputtered, abnormal discharge due to charging of oxide particles, as an insulating material, at the start of sputter discharging tends to occur. When abnormal discharge occurs, the surface of the target is partially heated, and thus melts and flies. As a result, oxide particles measuring several micrometers may adhere onto a magnetic recording medium disposed at an opposed position.

If the oxide particles thus adhere onto the magnetic recording medium, the incident that the particles collide with the head arises. To prevent this incident, the particles may be removed by sliding, for example, a cleaning tape over the medium having the film formed by sputtering. This sliding treatment peels not only the particles, but also the magnetic layer and a protective layer, causing problems such as signal defects or corrosion.

Japanese Patent 2948019 describes that the particle diameter of an insulating substance is set at 20 $\mu$m or less in order to resolve abnormal discharge occurring when sputtering is performed using a sputtering target comprising a sintered mixture of the insulating substance and a conductive substance. However, this sputtering target is used for film formation of a heating resistor thin film of a thin film thermal head. It has been unknown whether the sputtering target can be used for film formation of a magnetic layer of a magnetic recording medium because of its magnetic characteristics, for example.

SUMMARY OF THE INVENTION

Extensive studies have been conducted to prevent the foregoing abnormal discharge and adhesion of oxide particles onto a magnetic recording medium. By controlling the particle diameter of an oxide incorporated into a target for providing a magnetic layer, it has been found that abnormal discharge can be suppressed, and adhesion of oxide particles onto a magnetic recording medium can be prevented.

In the first aspect of the present invention, a sputtering target for film formation of the magnetic layer of a magnetic recording medium comprising at least a nonmagnetic undercoat layer, a magnetic layer, and a protective layer laminated sequentially on a nonmagnetic substrate comprises a mixture of a metal and an oxide, wherein a particle diameter of the oxide being 10 $\mu$m or less.

Here, the particle diameter of the oxide may be 5 $\mu$m or less.

The mixture may comprise an alloy containing at least Co and Pt, and at least one oxide selected from the group consisting of oxides of Si, Ti, Zr, Al and Cr.

In the second aspect of the present invention, a method for producing a magnetic recording medium comprising at least a nonmagnetic undercoat layer, a magnetic layer, and a protective layer laminated sequentially on a nonmagnetic substrate, comprises the step of forming the magnetic layer by RF sputtering of a sputtering target for the magnetic recording medium, wherein the sputtering target for the magnetic recording medium comprises a mixture of a metal and an oxide, and a particle diameter of the oxide in the sputtering target is 10 $\mu$m or less.

Here the particle diameter of the oxide in the sputtering target is may be 5 $\mu$m or less.

The sputtering target may be a mixture comprising an alloy containing at least Co and Pt, and at least one oxide selected from the group consisting of oxides of Si, Ti, Zr, Al and Cr.

In the third aspect of the present invention, a magnetic recording medium comprising at least a nonmagnetic undercoat layer, a magnetic layer, and a protective layer laminated sequentially on a nonmagnetic substrate, where the magnetic layer is a granular magnetic layer having a structure in which crystal grains containing Co and having ferromagnetism are surrounded with oxide grain boundaries, the magnetic layer has been obtained by RF sputtering of a sputtering target for a magnetic recording medium, the sputtering target comprising a mixture of a metal and an oxide, the oxide having a particle diameter of 10 μm or less, and defects attributed to particles of the oxide and measuring 0.05 μm or more are not present on a surface of the magnetic recording medium.

According to the present invention, a magnetic layer is formed by RF sputtering of the above-described sputtering target, whereby a granular magnetic layer having excellent magnetic characteristics and electromagnetic conversion characteristics can be formed by a simple process. Furthermore, the invention is free from the problem of adhesion of oxide particles onto a magnetic recording medium.

The above and other objects, effects, features and advantages of the present invention will become more apparent from the following description of embodiments thereof taken in conjunction with the accompanying drawings.

BRIEF DESCRIPTION OF THE DRAWINGS

FIGS. 2A and 2B are SEM (scanning electron microscope) images of the surface of a target used, in which FIG. 2A shows the target with an $SiO_2$ particle diameter of 10 μm or less according to the present invention, while FIG. 2B shows the target with an $SiO_2$ particle diameter of more than 50 μm, as a comparative example;

DETAILED DESCRIPTION OF PREFERRED EMBODIMENTS

The present invention will now be described in more detail with reference to the accompanying drawings.

Figure 1:
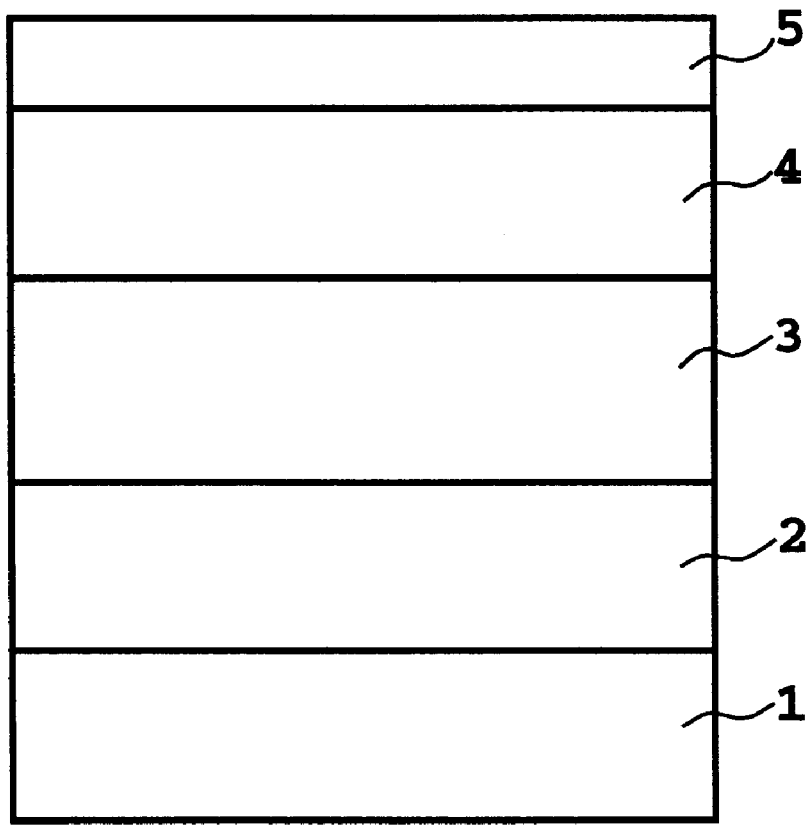
FIG. 1 is a schematic sectional view of a magnetic recording medium according to the present invention.

A sputtering target according to the present invention is used for film formation of a magnetic layer of a magnetic recording medium as an embodiment of the present invention as described in FIG. 1. FIG. 1 is a schematic sectional view of a magnetic recording medium showing an embodiment of the present invention. The numeral 1 denotes a nonmagnetic substrate, 2 a nonmagnetic undercoat layer, 3 a magnetic layer, especially, a granular magnetic layer, 4 a protective layer, and 5 a liquid lubricant layer.

The magnetic recording medium shown in FIG. 1 is obtained by a manufacturing method having the step of providing the nonmagnetic undercoat layer 2 on the nonmagnetic substrate 1, the step of providing the magnetic layer 3 on the nonmagnetic undercoat layer 2, the step of providing the protective layer 4 on the magnetic layer 3, and the step of providing the liquid lubricant layer 5 on the protective layer 4.

As the nonmagnetic substrate 1, there can be used, for example, a NiP-plated Al alloy substrate, glass substrate, or plastic substrate. The step of providing the nonmagnetic undercoat layer 2 on the nonmagnetic substrate 1 is performed by a conventional method such as sputtering. As the nonmagnetic undercoat layer 2, there can be used, for example, Cr or Cr alloy.

The step of providing the magnetic layer 3 on the nonmagnetic undercoat layer 2 is a step for RF sputtering of a target which is a mixture of a metal, especially, a ferromagnetic metal, and an oxide. In the present invention, it is important that the particle diameter of the oxide in the target be 10 μm or less in order to suppress the adhesion of oxide particles onto the magnetic recording medium. Preferably, the particle diameter of the oxide in the target is made 5 μm or less, whereby the adhesion of oxide particles can be suppressed completely.

The target available on this occasion may be a target of a composition which gives desired magnetic characteristics and electromagnetic conversion characteristics. Preferably, the target is one having the ferromagnetic metal portion which is an alloy at least containing Co and Pt. The oxide added to the alloy is preferably at least one oxide selected from the group consisting of oxides of Si, Ti, Zr, Al and Cr.

Then, the protective layer 4 is formed on the magnetic layer 3. The protective layer 4 can be formed by conventional method such as sputtering and CVD. For example, a layer of carbon 3 is used as protective layer 4. Optionally, the liquid lubricant layer 5 consisting of lubricant such as perfluoropolyether is formed on the protective layer 4 by dipping.

In above described matter, magnetic recording medium of the present invention is provided.

In the present invention, the particle diameter of the oxide added to the target used when providing the magnetic layer 3 is made small, as described earlier. By this measure, the degree of charging of the oxide observed particularly at the start of sputter discharging lowers to a level at which no abnormal discharge occurs. Thus, the oxide particles do not adhere any more onto the surface of the magnetic layer during the formation of the magnetic layer. That is, the magnetic recording medium having the magnetic layer formed with the use of the target in the present invention is free from defects occurring on the medium owing to the oxide particles and measuring 0.05 μm or more.

EXAMPLES

Example 1

A plurality of smooth-surface crystallized glass substrates (crystallized glass substrates TS-10 of (Kabushiki Kaisha) Ohara Inc., 3.5 inches (88.9 mm), 0.8 mm thick) as a nonmagnetic substrate 1 were readied for use. These glass substrates were washed, and then introduced into a sputtering device to form a pure Cr undercoat layer 2 with a film thickness of 15 nm on each of the glass substrates.

Then, a $(CoCr_{12}Pt_{12})_{95}$—$(SiO_2)_5$ target was subjected to RF sputtering at an Ar gas pressure of 5 mTorr to form a granular magnetic layer 3 with a film thickness of 20 nm. The target used on this occasion for film formation of the magnetic layer was a target containing $SiO_2$ particles with varying particle diameter.

On the magnetic layer, a carbon protective layer 4 with a film thickness of 10 nm was laminated, and the laminate was taken out of the vacuum. Then, a liquid lubricant was coated to a thickness of 1.5 nm to form a liquid lubricant layer 5. In this manner, a magnetic recording medium configured as shown in FIG. 1 was prepared. Heating of the substrate prior to film formation had not been performed.

Figure 2A:
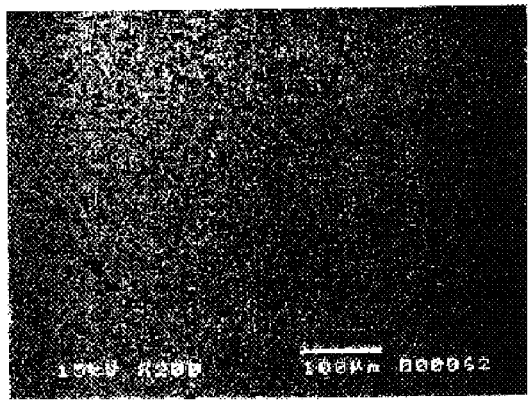
Figure 2B:
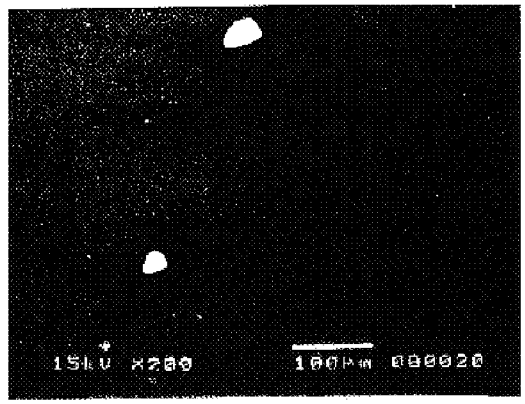

FIGS. 2A and 2B are SEM (scanning electron microscope) images of the surface of the target used, in which FIG. 2A shows the surface of the target containing $SiO_2$ particles having a particle diameter of 5 μm or less, while FIG. 2B shows the surface of the target containing $SiO_2$ particles having a particle diameter of more than 50 μm. These targets have an equal $SiO_2$ content of 5%, but the target of A and the target of B are found to be greatly different in the particle diameter of $SiO_2$.

Figure 3:
FIG. 3 shows an SEM image of foreign objects adhering onto the surface of a magnetic recording medium when a magnetic layer was formed using the target with an $SiO_2$ particle diameter of more than 50 μm, the target shown in FIG. 2B.
Figure 4:
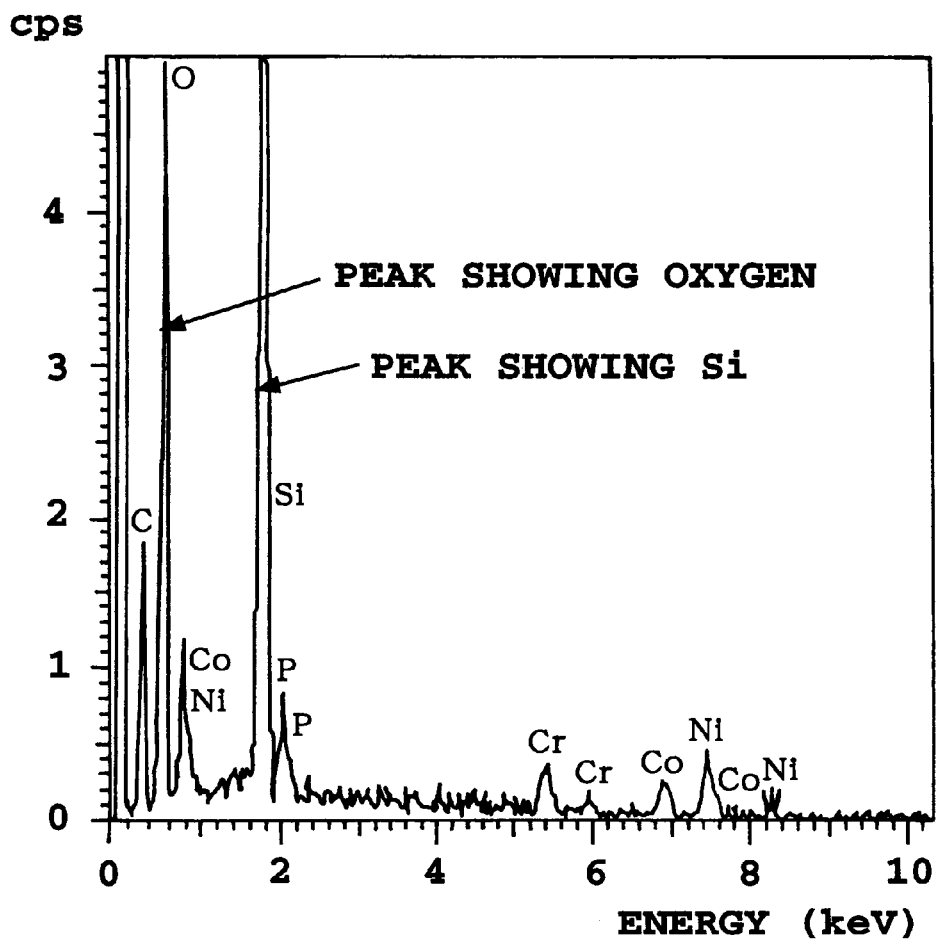
FIG. 4 shows the results of EDX (energy dispersive X-ray diffraction) analysis of foreign objects adhering onto the surface of the magnetic recording medium when the magnetic recording medium was prepared using the target with an $SiO_2$ particle diameter of more than 50 μm, the target shown in FIG. 2B.

FIG. 3 shows an SEM image of foreign objects adhering onto the surface of the magnetic recording medium when the magnetic recording medium was prepared using the target containing $SiO_2$ particles having a particle diameter of more than 50 μm, the target shown in FIG. 2B. FIG. 4 shows the results of EDX (energy dispersive X-ray diffraction) analysis of the foreign objects shown in FIG. 3. The foreign objects are found to be $SiO_x$, and have a size of about 10 μm.

In each of the magnetic recording media obtained in the above-described manner, the number of the foreign objects adhering onto the magnetic recording medium was measured with an optical appearance test device. Table 1 shows the particle diameter of $SiO_2$ contained in the target used when forming the magnetic layer, and the number of the foreign objects adhering onto the magnetic recording medium as the average value of the ten magnetic recording media. For comparison, the results obtained with the use of the target containing no $SiO_2$ are also shown.

TABLE 1

| Particle diameter of $SiO_2$ in the target | Number of foreign objects adhering to the medium (number per medium) |
|---|---|
| Comparison: no $SiO_2$ | 1 or less |
| 5 μm or less | 1 or less |
| 10 μm or less | 2.0 |
| 15 μm or less | 11 |
| 20 μm or less | 24 |
| 100 μm or less | 152 |

As shown in Table 1, when the particle diameter of $SiO_2$ is more than 10 μm, many foreign objects are detected on the magnetic recording medium. At a particle diameter of 10 μm or less, the number of foreign objects sharply decreases, and few foreign objects are detected at a particle diameter of 5 μm or less. Thus, controlling the particle diameter of $SiO_2$ added to the target is found to prevent the adhesion of foreign objects onto the medium.

Example 2

Magnetic recording media were prepared in exactly the same manner as described in Example 1, except that a $(CoCr_7Pt_{12})_{97}$—$(Cr_2O_3)_3$ target having different particle diameters was used as a target for formation of a magnetic layer.

In each of the magnetic recording media obtained in the above-described manner, the number of foreign objects adhering onto the magnetic recording medium was measured with an optical appearance test device. Table 2 shows the particle diameter of $Cr_2O_3$ contained in the target used when forming the magnetic layer, and the number of the foreign objects adhering onto the magnetic recording medium as the average value of the ten magnetic recording media. For comparison, the results obtained with the use of the target containing no $Cr_2O_3$ are also shown.

TABLE 2

| Particle diameter of $Cr_2O_3$ in the target | Number of foreign objects adhering to the medium (number per medium) |
|---|---|
| Comparison: no $Cr_2O_3$ | 1 or less |
| 5 μm or less | 1.2 |
| 10 μm or less | 1.9 |
| 20 μm or less | 19 |
| 100 μm or less | 255 |

Table 2 shows that as in the case of the $SiO_2$ containing target shown in Table 1, when the particle diameter of $Cr_2O_3$ is more than 10 μm, many foreign objects are detected on the magnetic recording medium. At a particle diameter of 10 μm or less, the number of foreign objects sharply decreases, and few foreign objects are detected at a particle diameter of 5 μm or less.

As discussed above, in connection with the target incorporating the oxide in the ferromagnetic alloy, the target used when forming a granular magnetic layer, the particle diameter of the oxide is controlled to 10 μm or less, preferably 5 μm or less, according to the present invention. By this measure, abnormal discharge during sputtering can be suppressed, and adhesion of oxide particles to the medium can be inhibited. The so controlled target is RF sputtered to form a granular magnetic layer. As a result, an excellent magnetic recording medium free from defects or corrosion can be produced by a simple process.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A magnetic recording medium comprising at least a nonmagnetic undercoat layer, a magnetic layer, and a protective layer laminated sequentially on a nonmagnetic substrate, wherein
    the magnetic layer is a granular magnetic layer having a structure in which crystal grains containing Co and having ferromagnetism are surrounded with oxide grain boundaries,
    the magnetic layer has been obtained by RF sputtering of a sputtering target for a magnetic recording medium, the sputtering target comprising a mixture of metal and an oxide, the oxide having a particle diameter of 5 μm or less, and
    defects attributed to particles of the oxide and measuring 0.05 μm or more are not present on a surface of the magnetic recording medium.

2. A magnetic recording medium comprising at least a nonmagnetic undercoat layer, a magnetic layer, and a protective layer laminated sequentially on a nonmagnetic substrate, wherein the magnetic layer has been obtained by RF sputtering of a sputtering target for the magnetic recording medium, the sputtering target comprising a mixture, which comprises an alloy containing at least Co and Pt, and at least one oxide selected from the group consisting of oxides of Si, Ti, Zr, Al and Cr, and the particle diameter of said oxide is 5 μm or less.

3. A magnetic recording medium including an RF sputtered magnetic layer sputtered from a sputtering target according to claim 2, the magnetic recording medium comprising:

a nonmagnetic substrate; and
a laminate which is comprised of:
  a nonmagnetic undercoat layer;
  a magnetic layer which is a granular magnetic layer having a structure in which crystal grains containing Co and having ferromagnetism are surrounded with oxide grain boundaries, and which is the RF sputtered magnetic layer; and
  a protective layer, and which is laminated sequentially on the nonmagnetic substrate, wherein the magnetic recording medium has no surface defects attributed to particles of the oxide which measure 0.05 $\mu$m or more.

* * * * *